United States Patent [19]
Schlais et al.

[11] Patent Number: 5,872,034
[45] Date of Patent: Feb. 16, 1999

[54] EPROM IN DOUBLE POLY HIGH DENSITY CMOS

[75] Inventors: John Robert Schlais, Gurnee, Ill.; Randy Alan Rusch, Kokomo, Ind.

[73] Assignee: Delco Electronics Corporation, Kokomo, Ind.

[21] Appl. No.: 963,489

[22] Filed: Nov. 3, 1997

[51] Int. Cl.$^6$ ............................................. H01L 21/8247
[52] U.S. Cl. ........................... 438/257; 257/315; 438/262; 438/316; 438/396
[58] Field of Search ............................ 257/315; 438/201, 438/396, 257, 262, 316

[56] References Cited

U.S. PATENT DOCUMENTS 5,014,098  5/1991  Schlais et al. ........................ 257/316

Primary Examiner—Olik Chaudhuri
Assistant Examiner—Willaim David Coleman
Attorney, Agent, or Firm—Jimmy L. Funke

[57] ABSTRACT

A method of making an EPROM transistor in a high density CMOS integrated circuit having a poly to poly capacitor and including two layers of polysilicon. The EPROM transistor is made using only the steps used to make the other components of the high density CMOS integrated circuit. The EPROM transistor is programmable at the low voltages which high density CMOS transistors can handle.

11 Claims, 9 Drawing Sheets

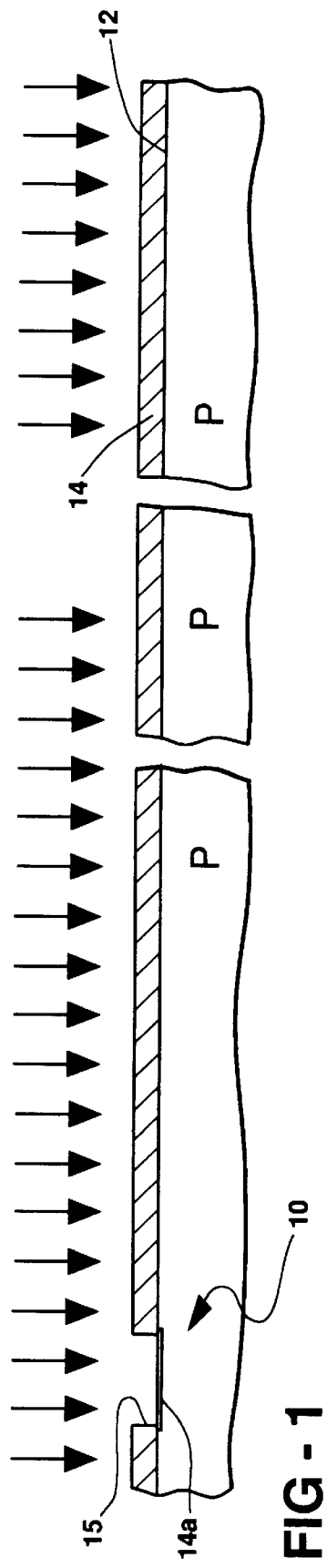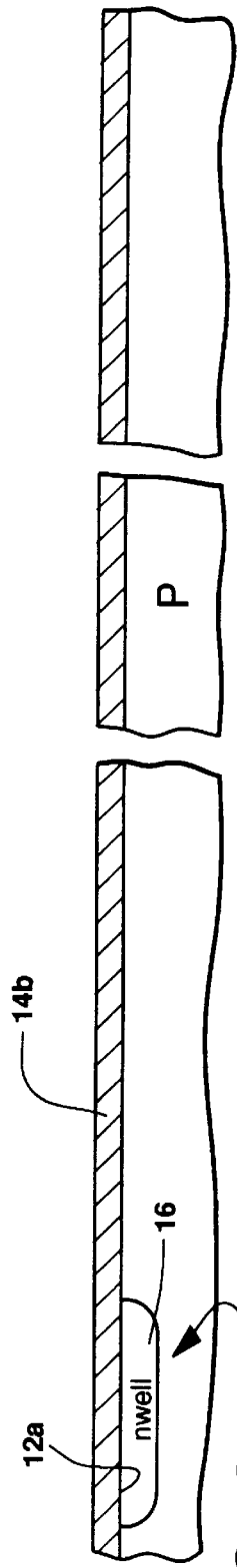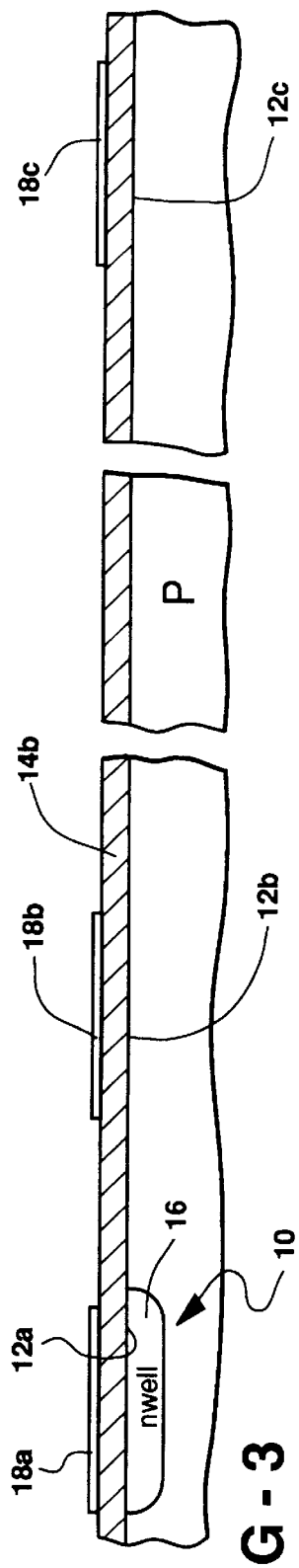

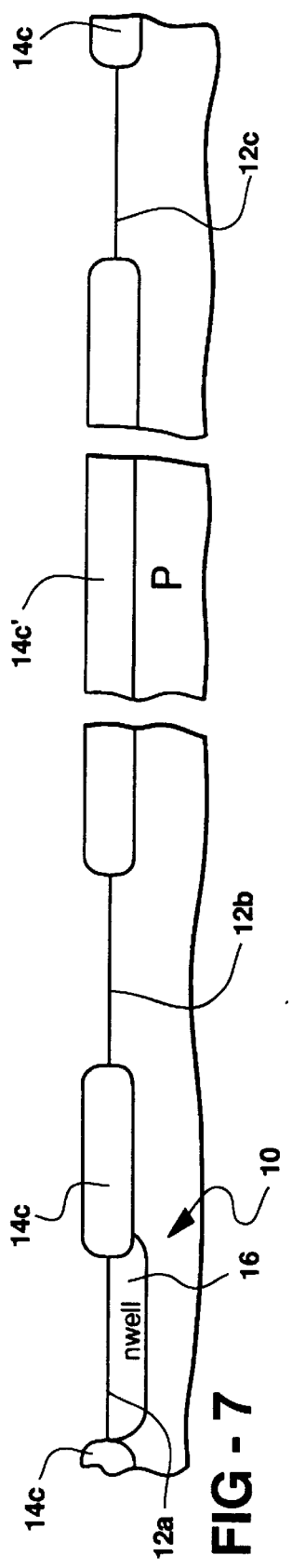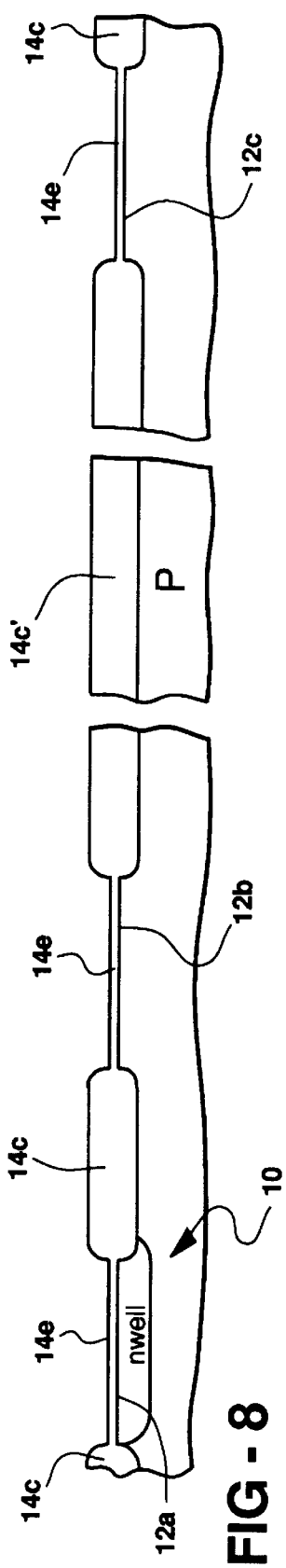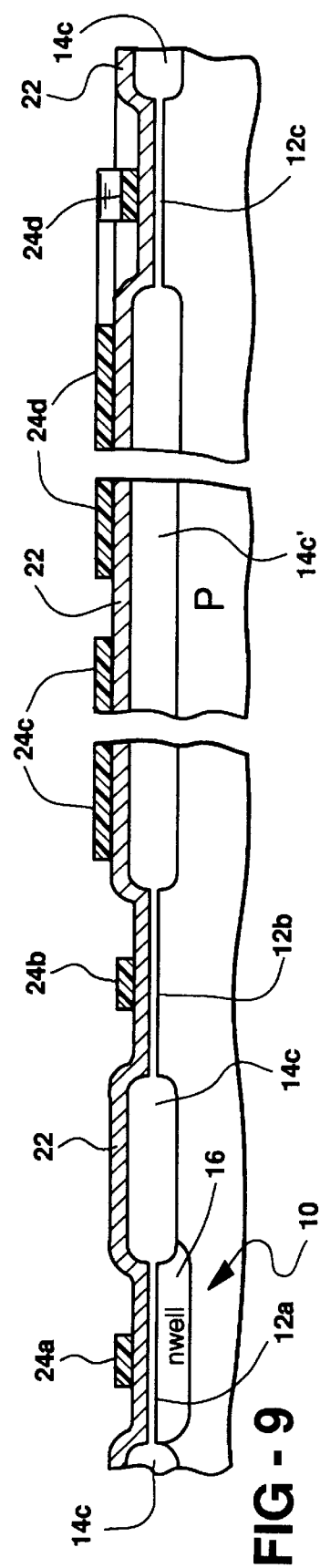

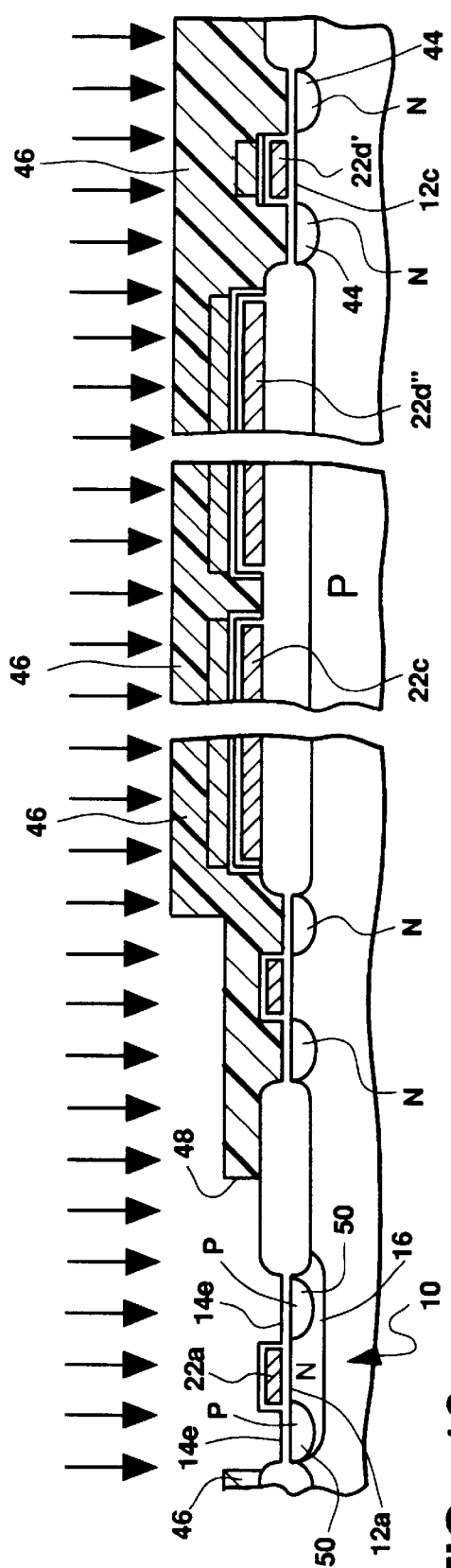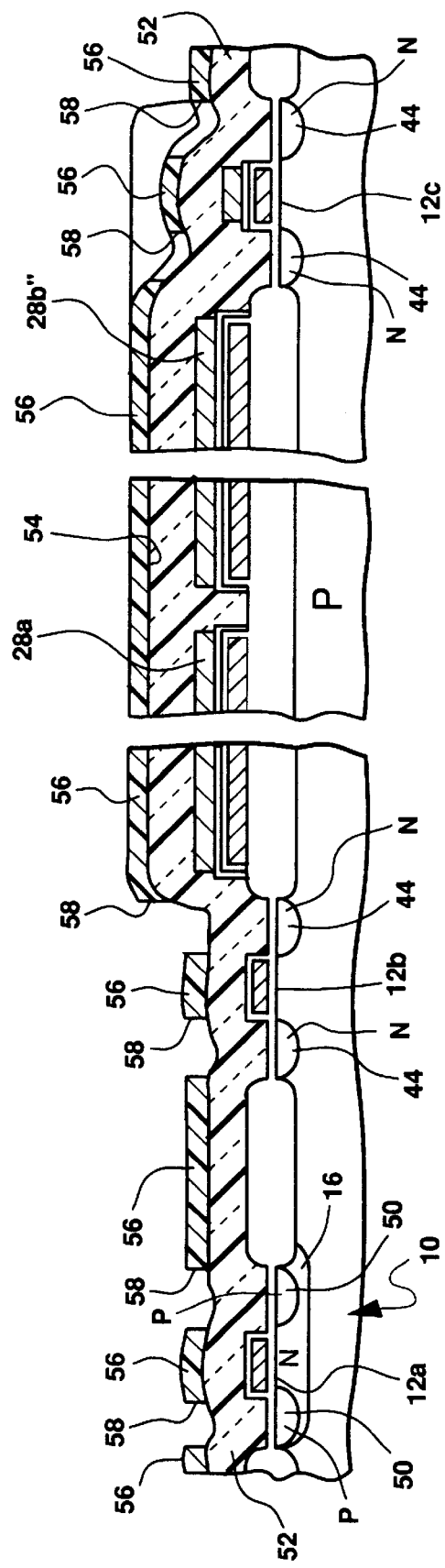

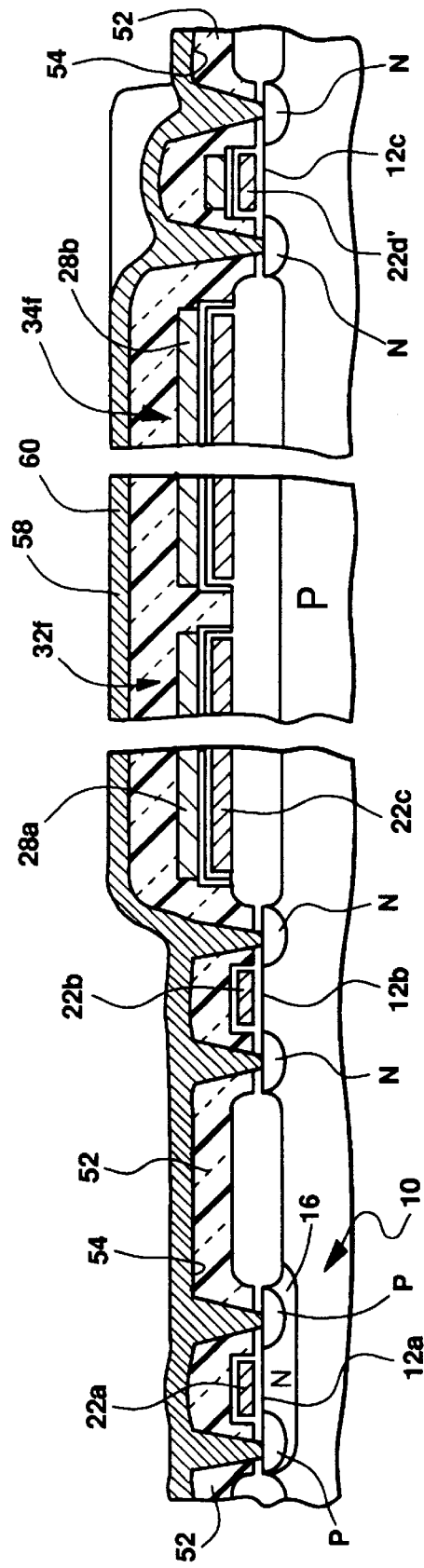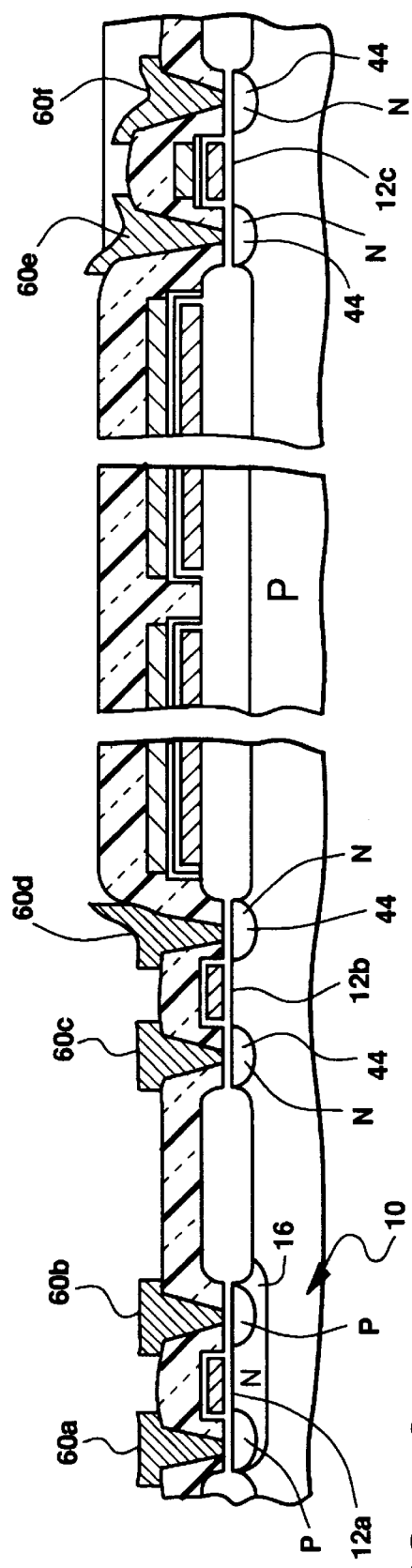

EPROM IN DOUBLE POLY HIGH DENSITY CMOS

RELATED PATENT APPLICATIONS AND PATENT

This patent application is related to the following two patent applications, filed concurrently with this as this patent application, and are filed in the names of J. R. Schlais and R. A. Rusch, and that are assigned to the same assignee as this patent application:

Application Ser. No. 08/963,463, entitled "EPROM in High Density CMOS Having Added Substrate Diffusion"; and Application Ser. No. 08/963,356, entitled "EPROM in High Density CMOS With Metallization Capacitor".

This patent application is also related to U.S. Pat. No. 5,014,098, entitled "CMOS Integrated Circuit with EEPROM and Method of Manufacture", that was issued May 7, 1991 to J. R. Schlais, R. A. Rusch and T. H. Simacek, and assigned to the assignee of this patent application. U.S. Pat. No. 5,014,098 is hereby incorporated herein by reference.

BACKGROUND OF THE INVENTION

1. Field of the Invention

This invention relates to a CMOS integrated circuit having an EPROM incorporated therein, and to a method of making the same. More particularly, this invention relates to an EPROM structure that is manufacturable using precisely the same process steps that are used to make a small geometry, i.e., high density, CMOS integrated circuit. In other words, no steps need be added to or subtracted from those used in making the small geometry CMOS integrated circuit. Accordingly, the EPROM can be made on the same chip as the small geometry CMOS transistors without compromising the CMOS transistors in any way, especially their speed of operation.

2. Description of the Prior Art

As indicated above, this invention relates to a high density CMOS integrated circuit having an EPROM (electrically programmable read only memory) device. The term "CMOS" is used in its usual context, but is also hereinafter defined for completeness of disclosure. An "EPROM" is a nonvolatile memory integrated circuit unit. It is thus an integrated circuit that has a memory that remains without the need of a power source. Hence, it is a lasting, or permanent, memory. As indicated by its name, an EPROM nonvolatile memory unit can be electrically programmed after manufacture. In addition, the programming, i.e., also the memory, can be erased as a single block by exposing the EPROM chip to ultraviolet light.

The EPROM is not to be confused with an EEPROM (electrically erasable programmable read only memory) device. An EEPROM is thus a nonvolatile memory integrated circuit unit. However, its programming can be selectively changed, i.e., erased, at each of its MOS transistor memory gates. Moreover, the EEPROM programming is changed electrically, not by the application of ultraviolet light. This requires additional process steps on an integrated circuit chip, which increases its cost significantly.

The EPROM and EEPROM nonvolatile memory integrated circuits are comprised of special types of MOS (metal oxide semiconductor) transistors that are often arranged in arrays. As is known, MOS transistors are also referred to as insulated gate field effect transistors (IGFETs). An IGFET has a control gate electrode that is disposed over a channel region that extends between spaced but adjacent source and drain regions embedded in a semiconductor surface. IGFETs of an EPROM and EEPROM memory array are a special form of IGFET in that they also have a second gate electrode. We sometimes herein refer to such IGFETs as EPROM transistors. The second gate electrode of such transistors is an electrically floating electrode that is disposed above the IGFET channel region but below the control gate electrode hereinbefore mentioned. It is electrically floating because it is electrically insulated from the control gate above it and the channel region below it, and has no electrical conductor for accessing it. An electrical charge is normally placed on the floating gate by the effects of tunneling or avalanche injection. Once an electrical charge is placed on the floating gate, the charge is trapped there until it is deliberately removed in some way. The trapped charge on the IGFET floating gate raises the threshold voltage of the underlying channel region of that IGFET. This raises the "turn on" voltage of that IGFET to a value above the voltage usually applied to turn that IGFET "on". Accordingly, that IGFET stays "off" even when a normal turn on voltage is applied to its gate. A floating gate IGFET memory unit of an EPROM or EEPROM memory array is thus "programmed" from a "one" to a "zero" by charging its floating gate. Selected floating gate IGFETs in an EPROM or EEPROM memory array which have been so programmed, will not turn on when the usual "turn on" voltage is applied to them. So programming the selected IGFETs of an EPROM or EEPROM memory array, is also referred to herein as programming the EPROM or EEPROM memory. Such programming can be erased, i.e. removed, by exposing the EPROM or EEPROM memory array to ultraviolet light, which allows the trapped charge on the floating gate of each programmed IGFET to escape. Such "programming" of an EEPROM can more conveniently be erased electrically by applying an appropriate electrical potential between the control (or "charging") gate and the channel of each programmed IGFET.

The related U.S. Pat. No. 5,014,098 relates to forming an EEPROM in a CMOS integrated circuit. It discusses the difficulties of the past in including nonvolatile memory devices in high density CMOS integrated circuit applications. In order to achieve high packing density, the cell size of the nonvolatile memory was minimized. One convenient way to reduce the cell size was to use a high programming voltage, allowing the capacitance between the control (or "charging") gate and the floating gate to be small. For Fowler-Nordheim tunneling, the tunnel oxide current equation dictates an absolute value of voltage required to pass tunnel current through it for a given tunnel oxide thickness. To obtain this voltage on the floating gate, the control gate voltage has to be increased when the control gate/floating gate to floating gate/substrate capacitance ratio is small. Also, for such tunneling to occur, a portion of the oxide between the floating gate and the channel must be thinner than is ordinarily used in the high density CMOS transistors.

The voltage applied to the floating gate (to achieve programming) is determined by the voltage applied to the control gate, and the ratio of (a) the control gate to floating gate capacitance to (b) the floating gate to substrate capacitance. This is what we mean by programming capacitance ratio. As the programming capacitance ratio increases, the programming voltage reduces. In other words, with a higher programming capacitance ratio, a lower control gate voltage can be used to trap enough charge on the floating gate to noticeably raise IGFET threshold voltage.

The capacitance ratio is primarily affected by the layout of the cell, i.e., a larger cell size will typically have a larger capacitance ratio. U.S. Pat. No. 5,014,098, shows that the floating gate and the control gate can be laid out with integral mutually overlapping plate-like enlargements that extend up onto field oxide adjacent the channel region of the EEPROM IGFET from which they extend. This increases the capacitance between the two gates without significantly increasing the floating gate to substrate (i.e., channel) capacitance.

There are many applications where it is desirable to combine nonvolatile memory with CMOS logic circuits. CMOS logic circuits are formed of complementary MOS transistors, or IGFETs. By complementary, we mean that the MOS transistors include both n-channel and p-channel MOS transistors. If one desires to make such logic circuits in high density (for high performance logic), the high density, i.e., small geometry, nonvolatile memory must be designed with relatively deep source and drain junctions and thick field oxides, to accommodate high voltage programming. On the other hand, high density CMOS ideally should have shallow junctions, thinner gate oxides, and thinner field oxides, because it would operate at 5 volts or less. Attempts to integrate even small amounts of such high density nonvolatile memory circuity with a high density CMOS logic circuitry, necessitates that the entire integrated circuit be dominated in some key respects by the requirements of the nonvolatile memory high voltage circuitry. The nonvolatile memory requirements tend to degrade the performance and reliability of the high density and low voltage CMOS logic, which typically has shallow source and drain junctions, thinner gate oxides, and thinner field oxides. The high voltage junctions used in the nonvolatile memory devices require deeper diffusions, which leads to longer channel lengths for the CMOS logic, to avoid short channel effects. This is undesirable since it results in slower logic devices. The thick field oxide of the nonvolatile memory devices increases the lateral encroachment, or "birds beak", in the CMOS logic. Hence, a greater limitation is present in the minimum pitch of doped regions. Another, and longer range, result of this is the limited shrinkability of such an integrated circuit device and process with a high density/high voltage nonvolatile memory device included.

At present, when forming a CMOS logic circuit with an EPROM or EEPROM device in a stacked polycrystalline silicon FLOTOX technology, i.e., polycrystalline silicon gates and a thin insulator for electron tunneling, compromises are required in order to insure that one of the polycrystalline layers of the nonvolatile memory device can be shared with the logic devices. This is usually done in one of two ways. One method is to first define the floating gate of the EPROM or EEPROM. A high temperature dielectric oxide is then grown which also serves as the gate oxide of the CMOS devices and the control gate dielectric of the nonvolatile memory device. Then the second layer of polycrystalline silicon is used to form the CMOS gates and the nonvolatile memory control gate. Thus, the same layer of polycrystalline silicon is shared for the control gate of the nonvolatile memory device and the CMOS gates. In this method, formation of the high temperature dielectric oxide for the CMOS and control gate tends to degrade the characteristics of the tunnel oxide in the nonvolatile memory device. This high temperature also shifts the implants in the CMOS devices, and thus creates a shift in the electrical characteristics of the resultant CMOS devices from what the original CMOS process would produce without inclusion of the nonvolatile memory device processing. Also, it is difficult to make a reliable gate dielectric from the silicon dioxide grown between the floating gate and the control gate of the nonvolatile memory device.

The second method is to grow the gate oxide and then mask and etch the windows for the tunnel oxide. A precleaning step for growth of the tunnel oxide then follows. The tunnel oxide is then grown, followed by a polycrystalline silicon deposition step. The first polycrystalline silicon layer is shared between the CMOS devices and the floating gate of the nonvolatile memory device. In this latter prior art method, the steps required between the gate oxidation and polycrystalline silicon deposition degrade the gate oxide and thus the performance of the CMOS circuit. The gate oxide is degraded by placing photoresist on it for the tunnel mask, the pre-tunnel oxide clean, and the tunnel oxidation itself. These steps may introduce contaminants into the gate oxide, and will certainly alter the thickness of the gate oxide during the tunnel oxidation.

It is therefore desirable to have a high reliability CMOS logic circuit in which a nonvolatile memory device can be included with negligible impact on both the CMOS circuit and the nonvolatile memory device. The related U.S. Pat. No. 5,014,098 shows how an EEPROM can be so included by adding process steps to the usual CMOS process that only have negligible impact on the CMOS devices. On the other hand, it is to be noted that additional process steps do in fact have to be included, which increases cost of the process, and might slightly reduce yields. In addition, the added conductor pattern needed for electrically erasing an EEPROM, significantly expands the size an EEPROM nonvolatile memory unit over that of an EPROM nonvolatile memory. This can increase cost significantly.

As indicated above, the nonvolatile memory device that is made in the related U.S. Pat. No. 5,014,098 is an EEPROM, not an EPROM. An electrical charge can be put on its floating gate by any one of several techniques, including the Fowler-Nordheim Tunneling action shown in the related U.S. Pat. No. 5,014,098. However, Fowler-Nordheim Tunneling requires that a spot of the gate oxide on the channel region be thinner than normal gate oxide. As also indicated above, this requires adding special steps to the process used to make the CMOS integrated circuit, to form the thinner oxide. However, the addition of the extra steps is offset by the benefit that the thinner oxide also permits electrical erasing by Fowler-Nordheim tunneling, as disclosed in the related U.S. Pat. No. 5,014,098. Hence, Fowler-Nordheim tunneling permits easy, fully electrical, reprogramming of the EEPROM on a selective IGFET basis.

We have now recognized that electrical erasing of a PROM is often not needed. In fact, no erasing at all may be needed, or that erasing prior to encapsulation is all that might be needed. In addition, we have recognized that block erasing, as opposed to selective IGFET erasing, may be satisfactory in many applications. Accordingly, we have recognized that an EPROM nonvolatile memory may be as useful as an EEPROM nonvolatile memory in many applications. Further, we have recognized that avalanche injection can be used to charge the floating gate of an EPROM using normal "gate" oxide thicknesses, i.e., oxide thickness between the floating gate and its underlying channel region. Still further, we have recognized that avalanche injection into the floating gate of an EPROM can be done at low voltages if the control gate/floating gate to floating gate/ substrate capacitance ratio is about two or greater. Still further, we have found that an EPROM can be included in a high performance CMOS integrated circuit unit using exactly the same process steps as are used to make the high performance CMOS transistors in such a unit. In other words, no steps need to be added to or subtracted from the high performance CMOS process in order to also make the EPROM on the same chip. All that is needed is to include our special EPROM structure features in selected ones of the masks used to make the CMOS circuitry. Accordingly, in our invention, a nonvolatile memory unit can be included in a CMOS integrated circuit made with two micron or less design rules, without any penalties or compromises at all in the CMOS circuitry.

SUMMARY OF THE INVENTION

The present invention is directed to an integrated circuit which comprises a distinctive erasable programmable read only memory (EPROM) combined in a unique way in a monolithic integrated circuit with high speed, or high performance, CMOS circuitry. By CMOS circuitry, we mean circuitry that is predominantly formed with complementary metal oxide semiconductor (MOS) transistors, i.e., n-channel and p-channel MOS transistors. As indicated above, MOS transistors are also referred to as IGFETs. By high speed, we mean that the design rule channel length of the CMOS transistors is about 2 microns or less. Ordinarily, the circuitry being referred to is CMOS logic circuitry on a monolithic integrated circuit chip, as, for example, a microprocessor chip. It is not unusual for other forms of circuitry also to be present on such a chip.

Thus, in the present invention, we focus on a monolithic integrated circuit that includes high performance CMOS circuitry and also some EPROM nonvolatile memory. The CMOS circuitry (i.e., the logic circuitry) is high performance because it has small geometry devices (i.e., two micron or less channel lengths), which gives the CMOS circuitry high density and high speed. An important feature of the invention is that the EPROM is present without adversely affecting the high performance characteristics of the CMOS circuitry. Another important feature of the invention is that the EPROM is made using exactly the same process steps used to make the high performance CMOS part of the circuitry. We sometimes refer to the high performance CMOS process steps as "two micron" process steps. By "two micron CMOS process", we mean a CMOS process having design rules allowing the mask for etching a polycrystalline silicon layer, which forms an IGFET gate electrode, to have a feature size of about two microns. By "feature size", we mean the nominal linear dimension of a polycrystalline silicon gate electrode between its associated source and drain in an IGFET. This dimension is also referred to as gate length of an IGFET. Accordingly, in our invention, the feature size of at least the CMOS circuitry in the integrated circuit is about two microns. With source and drain junction depths of about 0.35 micron, and a design rule feature size of two microns, the actual resulting channel length will be about 1.5 microns, due to lateral diffusion of the source and drain regions under opposite edges of the polysilicon gate electrode.

IGFETs having channel lengths less than two microns are often considered to be "high performance" or "high speed" in logic operation. For purposes of this invention, when we refer to a "high speed CMOS process", we mean a process capable of making CMOS logic IGFETs having channel lengths of less than about two microns. The EPROM may or may not have such a feature size, depending on the application.

In addition, the EPROM of this invention is programmable at voltages low enough to be handled by the high speed CMOS circuitry, which is usually about 5 volts or less. Accordingly, the high speed CMOS circuitry can be used to program the EPROM. This is true even though the EPROM has relatively thick gate oxide that does not permit Fowler-Nordheim Tunneling.

In this invention, the high speed CMOS integrated circuit is one that would be made by a double poly process, such as one that might be used to also make relatively large capacitors in the integrated circuit. The capacitors are made by overlapping first and second layers of polycrystalline silicon on top of field oxide. In this invention, some of the steps used to produce the MOS transistors are selected and combined with some of the steps use to make the poly capacitors on the field oxide. The combined steps are used to also form our distinctive floating gate and control (or "charging") gate structures for our EPROM. The distinctive gate structures provide a capacitance ratio between the control gate and the floating gate and between the floating gate and the substrate (i.e., essentially the IGFET channel) of about 2 or greater.

The capacitance ratio of about 2 or more permits the EPROM to have a normal gate oxide thickness under the floating gate and yet be programmable at voltages less than the parasitic breakdown voltages of the high speed CMOS circuitry. By "normal" gate oxide thickness, we mean the same gate oxide thickness that is used for the CMOS circuitry on that silicon chip. Accordingly, all that is needed to include an EPROM in a high performance CMOS circuit, is to incorporate some changes in selected masks used to make the CMOS circuit. No process steps need be added to the high speed CMOS process, as is needed in U.S. Pat. No. 5,014,098 Schlais, et al.

Other objects, features and advantages of this invention will become more apparent from the following detailed description taken together with the accompanying drawing and claims.

BRIEF DESCRIPTION OF THE DRAWING

FIGS. 1–19 each show a cross-sectional view through the same surface portion of a monocrystalline silicon wafer. The silicon surface portion shown in FIGS. 1–19 is but one part of one chip in a silicon wafer that contains a plurality of such chips. FIGS. 1–19 successively show use of a typical CMOS two micron dual poly process to form in that surface portion, from left to right in the Figures, a p-channel IGFET, and n-channel IGFET, a poly capacitor on field oxide, and an EPROM that has a part extending up onto field oxide. A two micron process is explained above. By dual poly, we mean a process that deposits two layers of polycrystalline silicon onto the silicon surface. The first deposited polycrystalline silicon layer is used to form the high performance CMOS gate electrodes. However, it is also used to form the bottom plate of a capacitor that is disposed on the field oxide. The second layer of polycrystalline silicon is used to form the top plate of the capacitor on the field oxide.

Figure 4:
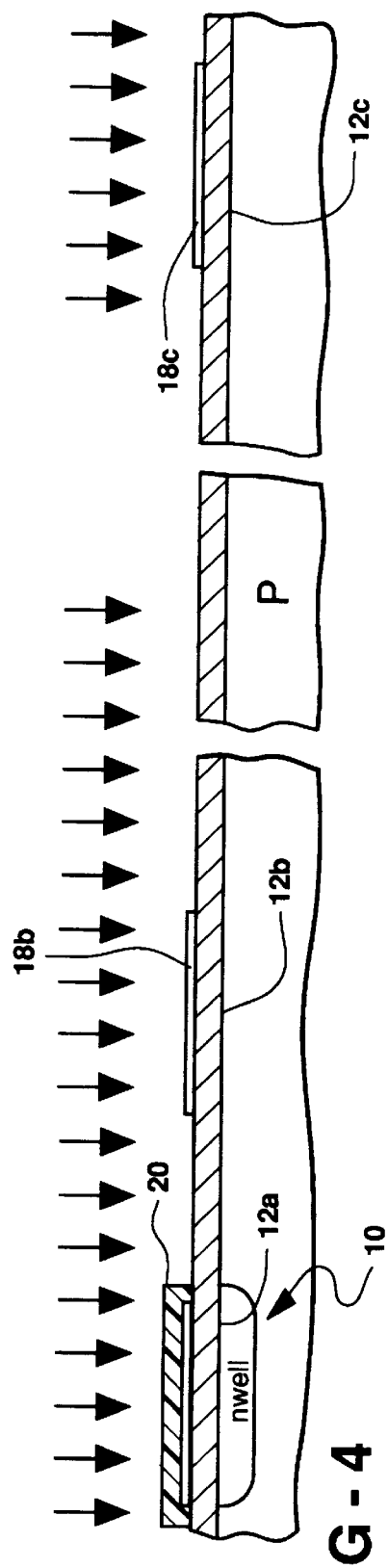

It should be understood that the various sheets of the Drawing are not necessarily drawn to scale, and exaggerations in thickness and relative sizes have been made to facilitate an easier understanding of the invention.

DETAILED DESCRIPTION

As shown in FIG. 1, a typical high speed CMOS process would start with an initial oxidation of a p-type silicon monocrystalline wafer 10. As indicated above, by high speed CMOS process, we mean a process for producing small geometry CMOS IGFETs with shallow junctions. By small geometry, we mean that the design rules for the process are for two micron or less. Also as indicated above, by a CMOS process having "two micron design rules" and/or a "two micron process", we mean a CMOS process having design rules allowing the poly etch mask (i.e., the mask used for etching a polycrystalline silicon layer) to define an IGFET gate electrode, to have a feature size of about two microns. By "feature size", we mean the linear dimension of an IGFET polycrystalline silicon gate electrode between its associated source and drain regions. This dimension can also be referred to as the design gate length. However, in the resultant IGFET, the actual channel length under the gate electrode is slightly less than the feature size. This is due to lateral diffusion of the source and drain regions under the outer edges of the gate electrode. For example, with source and drain junction depths of about 0.35 micron, lateral diffusion under opposed edges of a gate electrode of two micron feature size produces an actual channel length of about 1.5 microns. To avoid possible confusion, we refer to the gate electrode as having a "length" between source and drain regions (not a "width"), to be consistent with the language used in referring to channel length.

IGFETs with such small channel lengths operate at higher speed. That is why IGFETs having channel lengths less than two microns can provide "high performance" or "high speed" in logic operation. For purposes of this invention, when we refer to a "high performance CMOS process" or a "high speed CMOS process", we mean a process capable of making CMOS logic IGFETs having channel lengths of less than about two microns.

As indicated above, in this invention our EPROM is concurrently made in a silicon chip along with dual poly high performance CMOS circuitry. Our EPROM is made using selected ones of the same steps that are used to make the high performance CMOS, combined with selected ones of the same steps that are use to make the poly to poly capacitor. The monocrystalline silicon wafer 10 can be a homogeneous or epitaxial wafer having a surface 12 in which a plurality of integrated circuit chips would be integrally formed. Silicon surface 12 of each such chip would have many complementary transistor pairs and at least some poly to poly capacitors. While not shown, it might also have some poly resistors formed on the field oxide, or have diffused or ion implanted resistors formed in the silicon surface 12. In this invention, the silicon surface 12 would also have an EPROM. For simplicity, the drawing shows formation of only one CMOS pair, one poly to poly capacitor, and one EPROM. The reason is that in this invention, our distinctive EPROM structure is made by combining selected ones of the steps used to make each IGFET of the CMOS pair and the poly to poly capacitor.

The surface 12 of the silicon wafer 10 would preferably be doped P-type with boron to a conductivity of about 10–20 ohm-cm. Then, the surface 12 of wafer 10 is thermally oxidized. The thermal oxidation forms a silicon oxide blanket layer 14 of about 5500 angstroms thick on silicon surface 12, as shown in FIG. 1. Then, as also shown in FIG. 1, a window 15 is photolithographically opened in a portion of the oxide layer 14 over each site in the silicon surface 12 where an N-well is to be formed. The silicon surface 12 is exposed in the window at each such site. Then, a thin (about 500 angstrom thick) layer 14a of silicon oxide is thermally grown on the exposed silicon surface at each such site. FIG. 1 shows the wafer surface 12 after the thin oxide layer 14a has been thermally grown.

It is to be recognized that the oxide layer 14 will thicken slightly when the thin oxide layer 14a is grown in window 15. It is also to be noted that the oxide layer 14a is thin enough to allow ions to be implanted through it into its underlying silicon surface but is thick enough to protect surface 12 from implantation damage. FIG. 1 also shows that wafer 10 is given a blanket implant of an n-type impurity such as phosphorus. The implant is given in a dose of about $1 \times 10^{12}$ to $1 \times 10^{13}$ atoms per square centimeter, at an energy of about 60 to 180 keV. The thick oxide layer 14 masks all of surface 12 from the implant except over the surface sites within each window 15. In each window 15, the implant penetrates the thin oxide layer 14a and lodges atoms of dopant in the underlying site of silicon surface 12.

The implanted n-type dopant at each such site is then driven-in to a depth of about 2 microns to 8 microns by heating for about 1 to 6 hours in an annealing or oxidizing atmosphere. An n-well 16 is thus formed at each such site in silicon surface 12 where there was a window 15 in the thick oxide layer 14. The n-well 16 is an island-like n-type region inset into the p-type surface 12 of silicon wafer 10. This provides an integral n-type island in the p-type wafer where p-channel IGFETs can be formed. As indicated above, the combination of such p-channel IGFETs and n-channel IGFETs made on an adjacent part of silicon surface 12 provide a high speed CMOS pair.

As also shown in FIG. 2, the thick thermal oxide layer 14 is removed after n-well 16 is formed, and replaced with a thin thermally grown silicon oxide blanket layer 14b. Oxide layer 14b has a thickness of about 500 angstroms.

As can be seen from FIG. 3, thin oxide layer 14b is a pre-nitride oxidation, to prepare silicon surface 12 to receive a 1500–2500 angstrom thick silicon nitride blanket layer (not shown in blanket form) that is deposited by low pressure chemical vapor deposition. The silicon nitride blanket layer is then photolithographically masked and etched to form silicon nitride islands 18a, 18b and 18c on thin silicon oxide layer 14b. Silicon nitride islands 18a, 18b and 18c are respectively disposed over silicon surface areas 12a, 12b and 12c, where an MOS transistor, i.e., an IGFET, is to be formed. This would include our EPROM. These will be areas of significantly lesser oxide thickness on silicon surface 12. They are sometimes referred to as "active" areas, because "active" devices will be formed on most of them in the completed integrated circuit.

The silicon nitride islands 18a, 18b, and 18c are also shown in FIG. 4. As will hereinafter be seen, silicon nitride island 18a covers an active area 12a where a p-channel IGFET will be formed. Silicon nitride island 18b covers a silicon surface active area 12b where an n-channel IGFET will be formed. Silicon nitride island 18c covers an active area 12c where our distinctive EPROM is to be formed.

FIG. 4 also shows that the surface 12 is given a field ion implantation. For this implantation, the n-well 16 is protected from the implant by a covering patch 20 of photoresist. The field implantation is of an p-type impurity such as boron. The implantation is done in a dose of about $1 \times 10^{13}$ to $1 \times 10^{14}$ atoms per square centimeter, at an energy of about 15 to 40 keV. The field implant does not cause a conductivity type change, and does not form a part of this invention. It is thus not shown in the drawing, to simplify understanding of the drawing.

Figure 5:
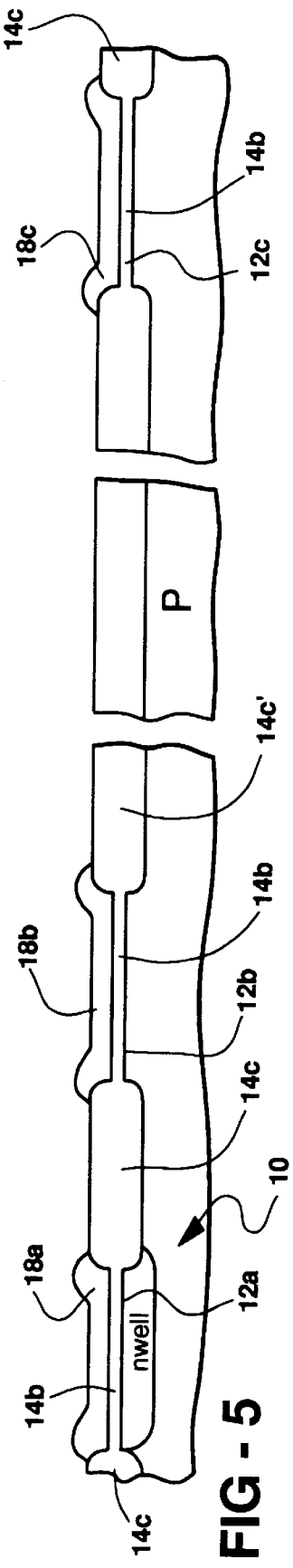

Reference is now made to FIG. 5. Following the field implant, the wafer 10 is heated in an oxidizing atmosphere to thermally grow an 8500 angstrom thick silicon dioxide layer in all areas of silicon surface 12 that are not protected by the silicon nitride islands 18a, 18b, and 18c. This 8500 angstrom thick thermal oxide is referred to as field oxide. It forms a thick oxide blanket or matrix 14c within which island-like thin oxide active areas 12a, 12b, and 12c are integrally disposed. A middle portion of this blanket or matrix is designated by the special reference numeral 14c__. It is given this special designation to specifically identify it as the portion of the field oxide layer 14c on which parts of the poly to poly capacitor and our distinctive EPROM will be disposed. This will become more apparent following the discussion of FIG. 9 and its following Figures.

After the desired thickness of field oxide is grown, the silicon nitride islands 18a–18c are removed, starting first with a silicon oxide etch to remove any silicon oxide surface film that may have formed on the silicon nitride during field oxidation. The silicon nitride islands 18a, 18b, and 18c are then etched away, as well as the thin silicon dioxide layer 14b that each of them covered on surface active areas 12a, 12b, and 12c.

Figure 6:
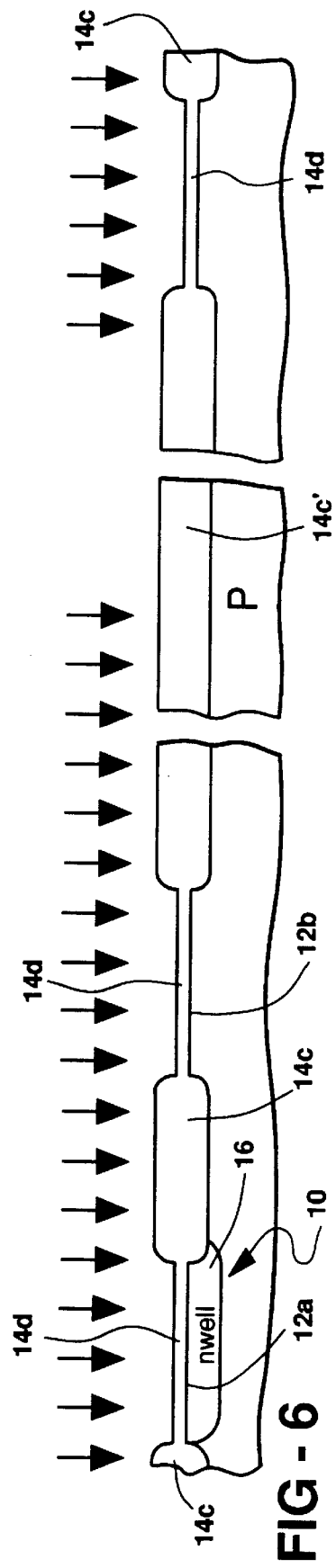
Figure 10:
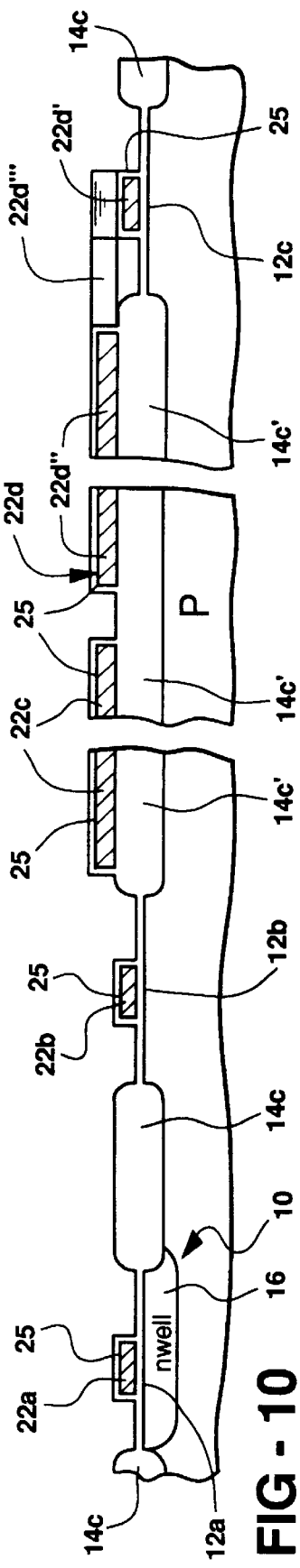

Referring now to FIG. 6, a 400 angstrom thick oxide layer 14d is then grown on the silicon surface active areas 12a, 12b, and 12c. This silicon oxide layer 14d is preferably grown under conditions similar to those used to form gate oxide 14e of FIG. 8. Silicon wafer 10 is then given a blanket enhancement implant of the dopant boron at a dosage of about $1 \times 10^{11}$ to $1 \times 10^{13}$ atoms per square centimeter at an energy of about 20 to 60 keV. The enhancement implant adjusts threshold voltage of the MOS transistors involved. This enhancement implant will inherently also adjust the threshold voltage at EPROM surface active area 12c. The adjustment sets their threshold values to a predetermined level.

FIG. 7 shows that following the blanket enhancement implant, the 400 angstrom thick oxide layer 14d is etched away from silicon surface active areas 12a, 12b, and 12c. A new 400 angstrom thick layer 14e is then thermally re-grown on these surface areas, as shown in FIG. 8. This new thermal oxide layer 14e is clean and suitable for use as a gate oxide for the IGFETs and EPROMs subsequently to be formed.

As can be seen in FIG. 9, a 3500 angstrom thick first polycrystalline silicon blanket layer 22 is then deposited on top of the gate oxide/field oxide layer 14e/14c. The polycrystalline silicon is alternatively sometimes referred to herein as "polysilicon" or "poly". The first poly blanket layer 22 is of LPCVD polycrystalline silicon that is doped with phosphorous or the like to be strongly n-type. As usual, conductivity, or doping, of the first polycrystalline silicon layer 22 can be of the order of about 15 ohms per square to 1500 ohms per square. Doping can be done in any convenient manner. The poly layer 22 is deposited immediately after growing the gate oxide 14e, to preserve the high quality and purity of gate oxide layer 14e as a gate dielectric for an MOS transistor.

As FIG. 9 also shows, the first polycrystalline silicon blanket layer 22 is covered with a photoresist mask that comprises patches, or mask elements, 24a, 24b, 24c and 24d. The photoresist mask exposes those portions of first poly blanket layer 22 that are to be etched away. The exposed portions of first polycrystalline silicon blanket layer 22 are first cleaned of any silicon oxide film incidentally formed thereon. Then, the exposed portions of the first polycrystalline silicon blanket layer 22 are completely etched away in a normal and accepted manner. This etching defines a first polycrystalline silicon pattern of electrodes and conductors on top of the silicon wafer 10. As usual, the first pattern includes self-aligning gate electrodes 22a and 22b for the CMOS transistors, and integral extensions of those electrodes and other associated conductors (not shown). The first pattern also includes a lower electrode 22c for a capacitor that is to be formed on top of field oxide portion 14c'. The size of lower electrode 22c would actually probably be much larger than shown. However, for convenience of illustration, its size is shown in a reduced form.

The first polycrystalline silicon pattern includes a further element 22d, that is an important part of this invention. It forms a floating gate electrode for the distinctive EPROM of this invention. This further element 22d is distinctive in that it has a relatively small sized part 22d' on active area 12c and a relatively large size part 22d" on field oxide part 14c', that are connected by an integral arm-like extension 22d'". Element part 22d' centrally crosses silicon surface active area 12c. Hence, element part 22d' provides a self-aligned gate electrode for our distinctive EPROM.

Figure 22:
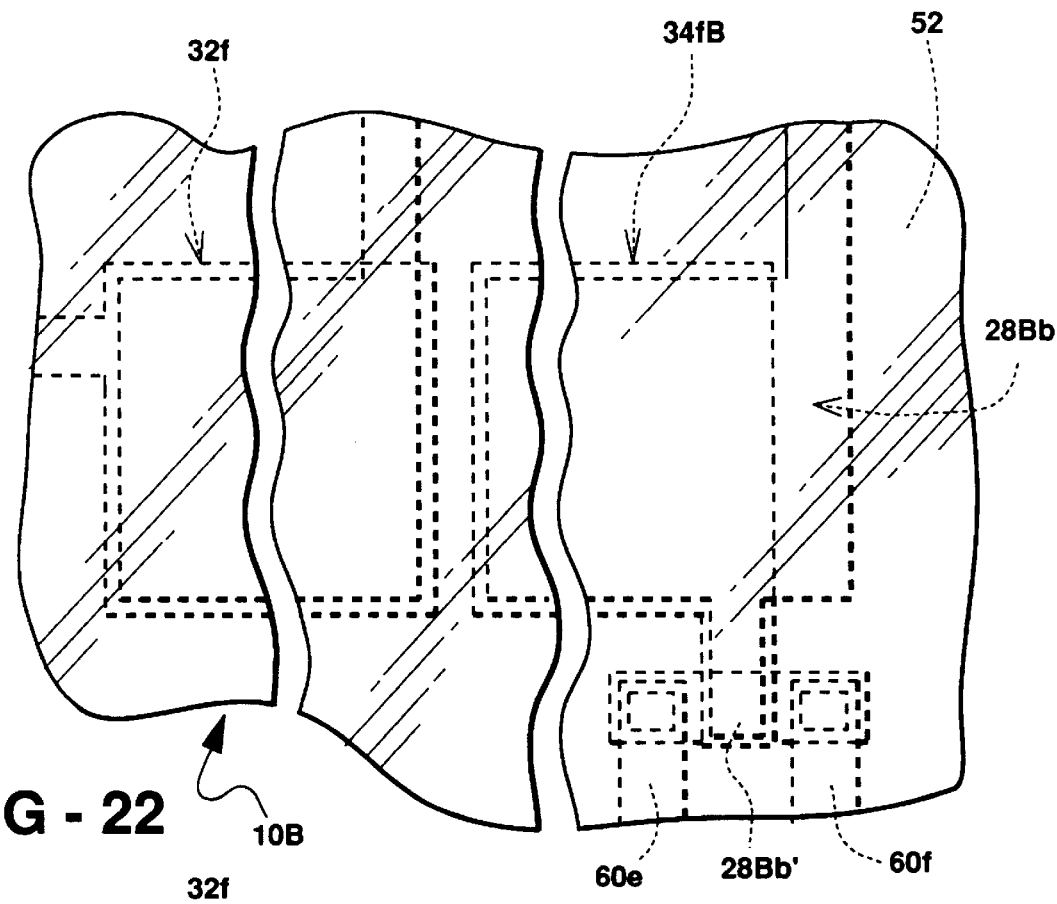
FIG. 22 shows a plan view of another alternative embodiment in our EPROM structure that could be substituted for that shown in FIG. 20, and is taken from the same perspective as FIG. 20, i.e., along a line such as line 20—20 of FIG. 13. However, it is shown after the metallization step, which is illustrated in FIG. 19.
Figure 23:
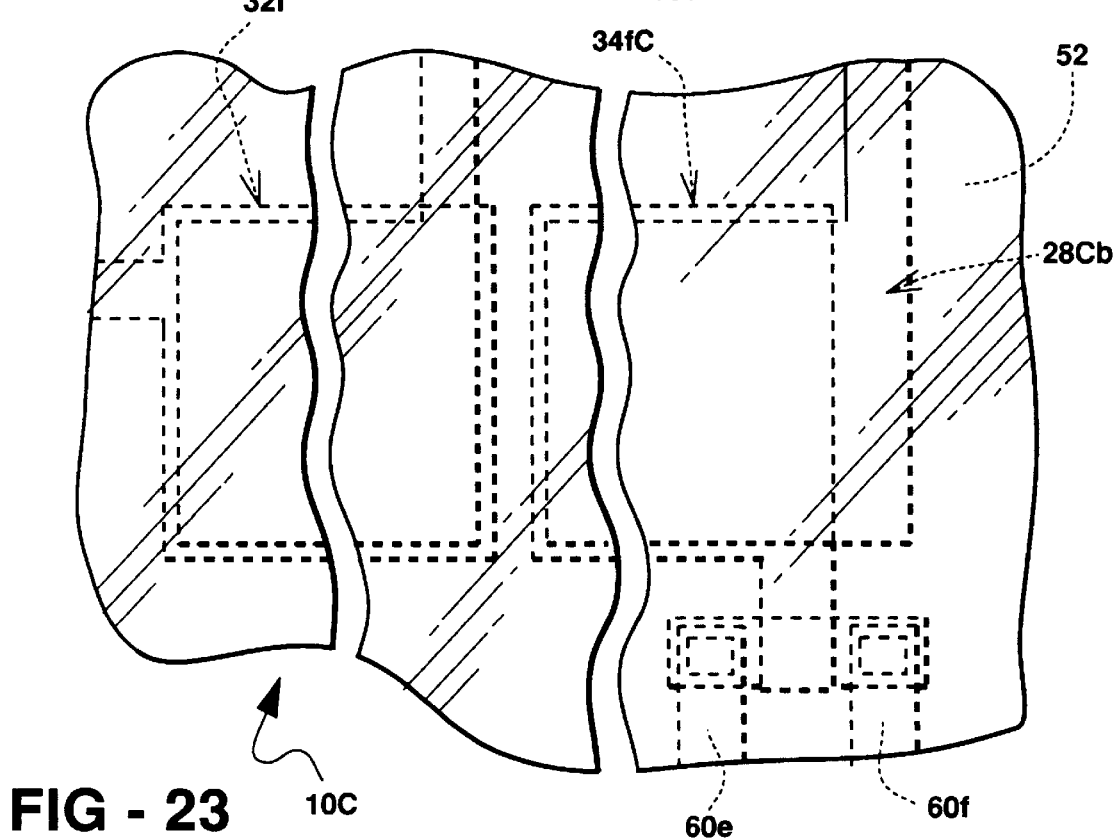
FIG. 23 shows a plan view similar to that of FIG. 22. However, it shows a variation in the control gate structure of the EPROM shown in FIG. 22.

The element part 22d" that is disposed on the field oxide is a relatively large, plate-like portion that forms the bottom plate of a capacitor that is integral with our EPROM. The size of part 22d" would actually be much larger than shown, especially with respect to the size of extension 22d'". However, for convenience of illustration, relative size of part 22d" has been reduced. More will be said later about the actual size of plate 22d" (in comparison with arm-like extension 22d'") in connection with capacitance between element part 22d and the silicon substrate 12, as it relates to the capacitance between element part 22d and an overlying control electrode 28b. In addition, extension 22d'" would probably have a somewhat different configuration in practice. It is shown as elongated and "L" shaped primarily for convenience of illustration, and for better comparison with the steps used in making plate 22c of the poly to poly capacitor 32f that is concurrently formed. This comment is also analogously applicable to upper plates 28a and 28b that will hereinafter be described. As will be explained later in this description, one would probably prefer a short and straight extension 22d'" on plate 22d, and a similar one on upper plate 28b, to minimize cell size. Such configurations are illustrated in FIGS. 22–23.

Figure 11:
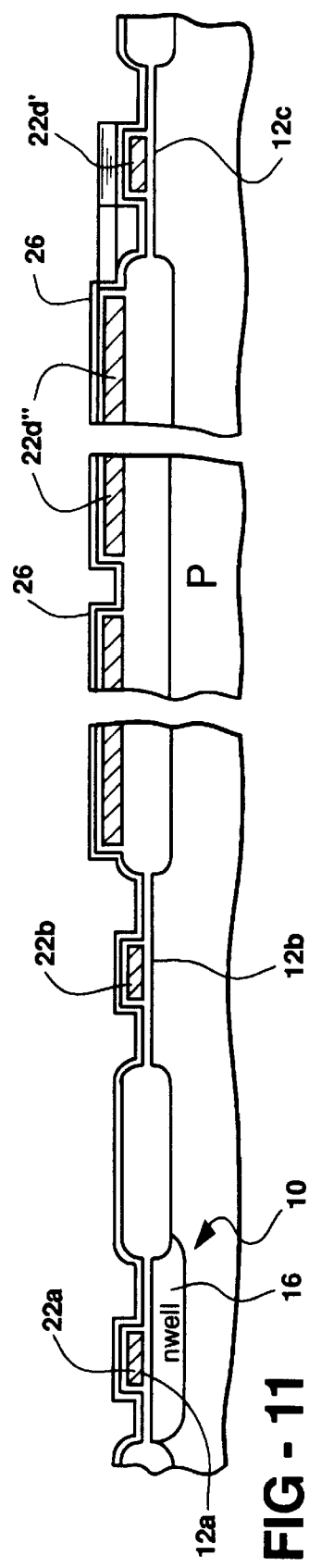

After etching the first polycrystalline silicon blanket layer 22 into the above-mentioned pattern, the photoresist etch mask is removed, and a 300–350 angstrom thick silicon oxide layer 25 is thermally grown on the exposed surface of the polycrystalline silicon pattern elements 22a, 22b, 22c and 22d. This produces the structure on silicon surface 12 as illustrated in FIG. 11.

An approximately 200 angstrom thick silicon nitride blanket layer 26 is then deposited on silicon wafer 10 over silicon oxide layer 25. This produces a second dielectric layer 26 on the exposed surfaces of the first polycrystalline silicon pattern segments 22a, 22b, 22c, and 22d. It results in a structure such as shown in FIG. 11.

Figure 12:
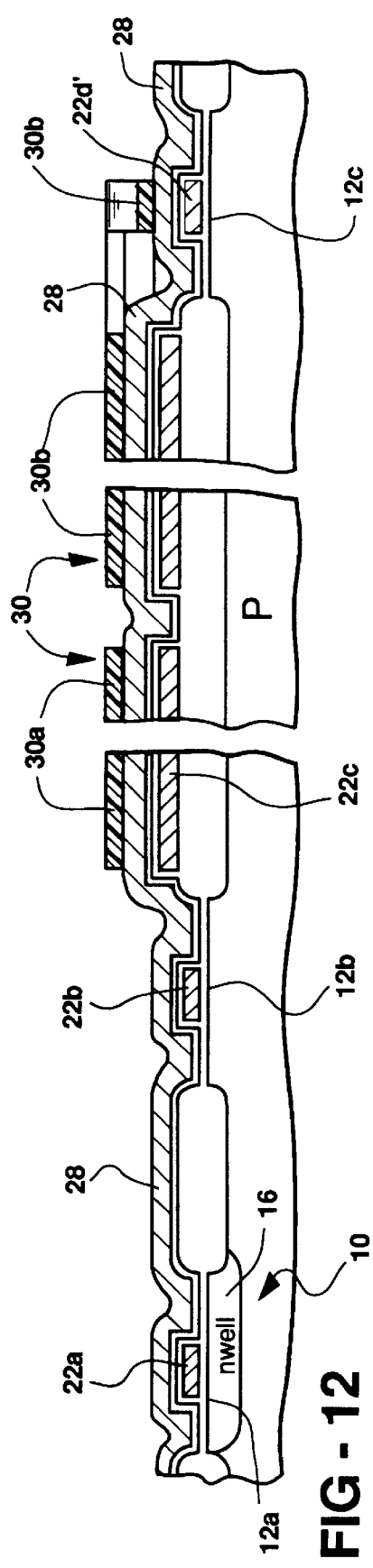

A second blanket layer 28 of polycrystalline silicon is then deposited by LPCVD or the like on top of the silicon nitride blanket layer 26, as seen in FIG. 12. The second polycrystalline silicon blanket layer 28 is about 3000–4000 angstroms thick, and is doped to be strongly n-type, as deposited or by subsequent diffusion. This gives second polycrystalline silicon blanket layer 28 significant electrical conductivity, which provides a material that can function as an electrode. The second polycrystalline silicon blanket layer 28 is then covered with a photolithographically defined photoresist etch mask 30, as shown in FIG. 12. The etch mask pattern 30 comprises segments 30a and 30b. After such masking, the second polycrystalline silicon blanket layer 28 is etched in a normal and accepted manner, to delineate a second polycrystalline silicon pattern, which comprises second polycrystalline silicon pattern segments 28a and 28b.

The portions of the second polycrystalline silicon blanket layer 28 that are etched away expose underlying parts of the silicon nitride layer 26. These exposed underlying parts of the silicon nitride layer 26 are also etched away, in a normal and accepted manner. The photoresist etch mask is then removed, which results in the surface structure on wafer 10 that is illustrated in FIG. 13.

Segment 28a of the second poly layer 28 forms a top plate of a capacitor, indicated by reference numeral 32f, that is disposed on field oxide portion 14c'. This capacitor, typically referred to as a poly to poly capacitor, comprises bottom polysilicon plate 22c, a silicon oxide layer on plate 22c, a silicon nitride layer on the silicon oxide layer, and top polysilicon plate 28a. Poly to Poly capacitor 32f is not new. It is known to use such a double poly process to form poly to poly capacitors such as capacitor 32f. On the other hand, we have recognized that the second polycrystalline silicon layer 28 can also be used for another function. It has characteristics that also make it useful as a charging gate for an EPROM. Hence, in this invention, when the second polycrystalline silicon layer 28 is etched to define the top plate of capacitor 32f, it is also etched to concurrently define a charging gate 28b for our EPROM 34f. This is analogous to the etching of first polycrystalline silicon layer 22, from which the bottom plate 22c of capacitor 32f and the floating gate 22d of EPROM 34f are concurrently defined. The floating gate was also referred to above as first silicon layer element 22d. It is to be noted that in this application, the poly to poly capacitor reference numeral has the suffix "f". For comparison, the two contemporaneously filed related patent applications referred to above respectively have a corresponding substrate capacitor and metallization capacitor.

Figure 20:
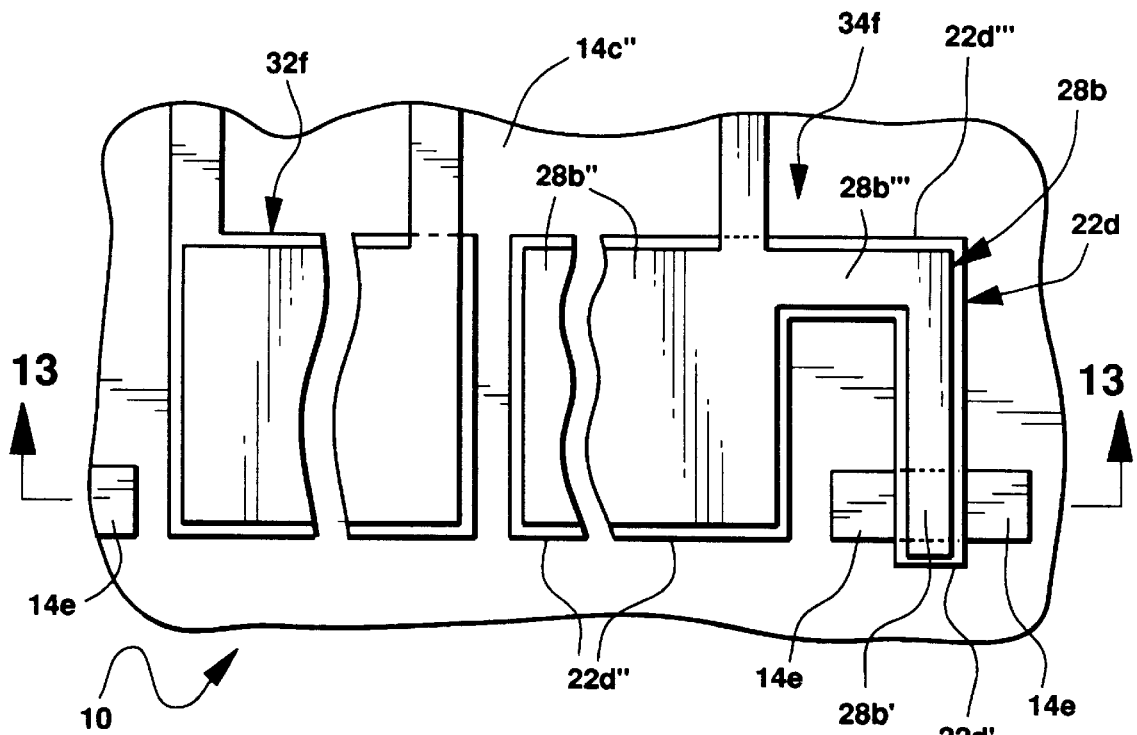
FIG. 20 shows a plan view of a poly to poly capacitor and our EPROM along the line 20—20 of FIG. 13.

As seen more clearly in the plan view of FIG. 20, charging gate 28b is of the same general configuration but slightly smaller than the floating gate 22d. Also, charging gate 28b is generally registered over the floating gate 22d, with its edges slightly inboard of the edges of floating gate 22d. Accordingly, it has a large plate-like portion 28b'' disposed over first silicon element 22d''. Plate-like portion 28b'' has an integral arm-like extension 28b''' that is disposed over first silicon element arm-like portion 22d'''. Arm-like extension 28b''' has an end portion 28b' that is disposed over first silicon element end portion 22d'. Hence, is crosses active area 12c under thin oxide layer 14e. This plate configuration is unique for an EPROM and is an important feature of this invention.

Figures 13, 14, 15:
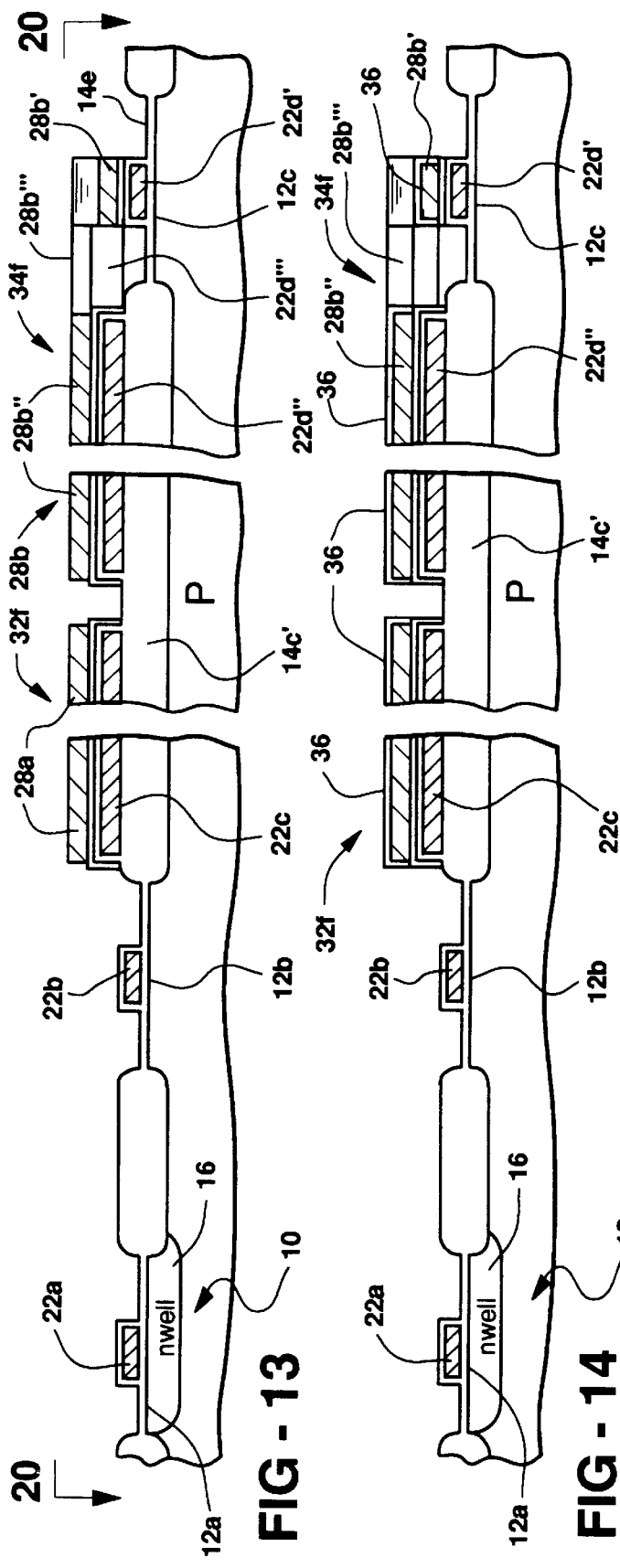

As can be seen better in FIG. 13, the laminations of EPROM 34f are similar to those of capacitor 32f. Hence, EPROM 34f comprises lower polycrystalline silicon element 22d and a covering silicon oxide layer. A silicon nitride layer covers the silicon oxide layer. The charging gate 28b is disposed on the silicon nitride layer. Charging gate 28b is thus separated from the floating gate 22d by two thin dielectric layers (formed from blanket layers 25 and 26). This provides a relatively large capacitance and high dielectric quality therebetween, analogous to poly to poly capacitor 32f. On the other hand, floating gate 22d is spaced from the underlying silicon of wafer 10 by the thick field oxide 14c', except for arm end 22d'. This provides a relatively low capacitance between floating gate 22d and the underlying silicon of wafer 10. It should be mentioned that in a double poly capacitor such as capacitor 32f on field oxide portion 14c', one would ordinarily use the silicon nitride to fill any pin holes that might occur in the polyoxide formed on the lower capacitor plate 22c. This ensures adequate dielectric strength between the capacitor plates 22c and 28a, as well as between EPROM floating gate 22d and EPROM charging gate 28b.

Accordingly, FIGS. 13 and 20 show our distinctive EPROM 34f along with a rather conventional double poly capacitor 32f disposed on field oxide portion 14c'. Our distinctive EPROM 34f has a large portion disposed on field oxide portion 14c'. It has a small integral extension crossing active area 12c. The portions 22d'' and 28b'' are sized to provide a relatively large capacitance between the floating gate and the charging gate, as compared to the capacitance between the floating gate 22d and the substrate wafer 10. This floating gate/charging gate capacitance should be at least twice the floating gate/wafer capacitance. If this capacitance ratio is about two or greater, preferably 3:1 to 5:1, or still greater, the floating gate of the EPROM can be charged at relatively low voltages, i.e., 14 volts or less, typically 8–12 volts. Such low voltages are of a level that can be safely handled by the high performance CMOS transistors. Hence, in this invention, the high performance CMOS transistors can be used for programming an EPROM IGFET. In other words, a separate group of higher voltage programming transistors need not be included in the circuit. This simplifies the resulting integrated circuit not only from a circuitry standpoint but also from a fabrication standpoint. Process steps to make the high voltage transistors need not be included. As hereinbefore indicated, adding steps to the preferred high performance CMOS process can compromise the performance of the high density CMOS transistors being made from the modified high performance CMOS process. Hence, our invention provides still another advantage.

The next step of the dual poly process is shown in FIG. 14. A 200–250 angstroms thick silicon oxide layer 36 is grown on the exposed surfaces of the second polycrystalline silicon pattern segments 28a and 28b. This seals the upper surface of the segments 28a and 28b, to prepare them for the final steps of the process.

In the following steps of the process, the high performance MOS transistors are formed in the integrated circuit. As indicated above, the high performance MOS transistors are formed with geometries that provide nominal gate lengths of about two microns or less and attendant channel lengths of about 1.5 micron or less. The steps used to finish the integrated circuit are identical to what might be used in any high speed CMOS process that would include deposition of two layers of polycrystalline silicon. As indicated above, two layers of polycrystalline silicon are typically used when one wants to include a large capacitor on field oxide in the integrated circuit. This permits the capacitor to have plate voltages independent of silicon substrate voltage.

Next, as shown in FIG. 15, the upper surface of the silicon wafer 10 is masked with a thick blanket layer of photoresist 38. Windows 40 and 42 are then opened photolithographically in the blanket photoresist layer 38 over each of active areas 12b and 12c. As indicated above, an n-channel MOS transistor; i.e., IGFET, is to be formed in active area 12b. Our special EPROM is to be formed in active area 12c. As previously indicated, each chip on wafer 10 will have many areas such as active areas 12a–12d.

The silicon wafer 10 is then given an N+ implant to form the n-type source and drain regions 44 on either side of the self-aligned silicon gate electrodes 22b and portion 22d' of 22d, which are respectively disposed in the active areas 12b and 12c. Implantation of N+ source and drain regions 48 can be done in the usual manner, as for example with an implant of the n-type dopant arsenic or co-implant of the n-type dopants arsenic and phosphorous, at a dosage $1 \times 10^{15}$ to $1 \times 10^{16}$ atoms per square centimeter at an energy of about 25 to 200 keV.

The photoresist 38 is then removed and the surface of silicon wafer 10 is cleaned. Then, silicon wafer 10 is heated for an appropriate time to drive in the implanted dopant somewhat and to help move the implanted n-type dopant into substitutional positions in the crystal lattice of silicon active regions 12b and 12c, which results in formation of N+ regions 44. These implanted N+ source and drain regions 44 are initially deepened by the drive-in heating step but are driven-in even further during following heating steps of the process.

A new blanket layer 46 of photoresist is then applied to the upper surface of wafer 10. As shown in FIG. 16, a window 48 is then photolithographically opened in photoresist layer 46 over each active area 12a on the upper surface of silicon wafer 10. Active area 12a is disposed over each n-well 16, where a p-channel MOS transistor is to be formed. The upper surface of silicon wafer 10 is then given a blanket P+ implant using the p-type dopant boron or $BF_2$. The implant is at a dosage of about $5 \times 10^{14}$ to $6 \times 10^{15}$ atoms per square centimeter, and at an energy of about 20 to 80 keV.

Analogous to the preceding N+ implant, the P+ implant does not penetrate the photoresist layer 46, the 8500 angstrom thick field oxide, or the polycrystalline silicon self-aligned gate electrode 22a. On the other hand, it can penetrate the thin silicon oxide layer 14e on either side of the self-aligned silicon gate. The implanted ions form p+ regions 50 in n-well 16, on either side of the gate electrode 22a. Then, the photoresist layer 46 is removed. Thereafter, the silicon wafer 10 is heated to drive-in the implanted p-type dopant, forming P+ source and drain regions 50. The upper surface of wafer 10 is then ready to begin the metallization process. Any of the normal and accepted techniques can be used for metallization.

In one example of metallization, the upper surface of wafer 10 is given a blanket layer 52 of boro-phosphosilicate glass (BPSG) or phosphosilicate glass (PSG), as shown in FIG. 17. It can be deposited by low pressure chemical vapor deposition (LPCVD) or plasma enhanced chemical vapor deposition (PECVD) to a layer thickness of about 5000 angstroms. The blanket PSG layer 52 is then densified in an appropriate heating step, which reflows it and smooths out its upper surface 54. One example of densification heating is to heat at about 900° C. for about 15 minutes.

A thin layer of a spin-on-glass (SOG) (not shown) an be applied onto the PSG layer upper surface 54, and hen densified, as for example by heating at about 825° C. for about 10 minutes. This provides a smooth and impervious upper surface 54 on the PSG glass blanket layer 52.

A blanket photoresist coating is then applied to the glass upper surface 54, and photolithographically defined into a contact mask that is comprised of segments 56. The contact mask has a contact window 58 over each area where an electrical contact is desired. The resultant upper surface of wafer 10 is shown in FIG. 17.

The upper surface of wafer 10 is then plasma etched or reactive ion etched to open contact windows in the glass layer 52. Concurrently, the etching also removes any silicon oxide layers exposed at the bottom of the contact windows. Such windows are opened to each of the source and drain regions 44 and 50, and also to each gate electrode of the CMOS circuitry that requires a separate contact. However, the CMOS gates are ordinarily not contacted in the silicon surface active areas themselves. Instead, they are contacted in other locations, remote from the channel region of the MOS transistor for which they are a gate. In some instances, the polycrystalline silicon itself forms a connecting network between MOS transistors so that no direct contact to each gate is made anyway. Accordingly, and for simplicity, in FIG. 18 no gate contact window is shown opened to the gate electrodes 22a, 22b and 22d' that are respectively above active areas 12a, 12b, and 12c.

In addition, a contact window could be opened to both of the plates 22c and 28a of the capacitor 32f on the field oxide, and also to the charging gate 28b of the EPROM. It is to be noted that the source and drain regions of the EPROM are to be contacted, analogous to the contacts made to the source and drain of each MOS transistor. Accordingly, windows are opened in the glass layer 52 to accommodate them.

After the contact windows are opened in the glass layer 52, a blanket coating 60 of one or more contact metals is deposited onto the upper surface of the glass layer 54. In one example, a single layer of an aluminum alloy could be used. The result is as shown in FIG. 18.

The blanket coating 60 of contact metal is then photolithographically masked and etched, to delineate a plurality of metal contacts 60a–60f on the upper surface 54 of glass layer 52, as seen in FIG. 19. Any of the conventional metallization techniques can be used to form contacts 60a–60f.

As indicated above, the larger portions 22d" and 28b" of the EPROM floating and control gates are sized to provide a significantly larger capacitance than exists between floating gate 22d and silicon substrate 10. By including these large portions in the EPROM cell, the cell becomes larger. However, it permits one to achieve a higher ratio in the charging gate to floating gate capacitance (Ccg-fg) divided by the floating gate to substrate capacitance (Cfg-s). The ratio of Ccg-fg/Cfg-s should be at least about 2. This permits the floating gate to be charged at lower voltages, typically of less than about 12 volts. This is compatible with CMOS circuits that use a five volt supply voltage and have a breakdown voltage of about 17 volts.

As also indicated above, the floating gate 22d and the charging gate 28b are designed to have a large overlap area in plate portions 22d" and 28b". Since these portions are separated by a relatively thin layer of dielectric, they have a relatively large capacitance between them. On the other hand, floating gate portion 22d" is disposed on the relatively thick field oxide 14c', it has a relatively low, and at least significantly lesser capacitance with its underlying parts of silicon substrate 10. As indicated above, the ratio of these capacitances should be at least 2:1 and preferably greater. A greater ratio will allow charging of the floating gate at even lower voltages, which is advantageous for a variety of reasons, as indicated above. The arm-like extensions 22d'" and 28b'" of the floating and charging gates 22d and 28b have analogous capacitance differences. However, they comprise only a relatively small part of the total area of their respective electrodes 22d and 28b. Accordingly, the arm-like extension 28b''' of charging gate 28b adds little to the capacitance between charging gate 28b and floating gate 22d.

Figure 21:
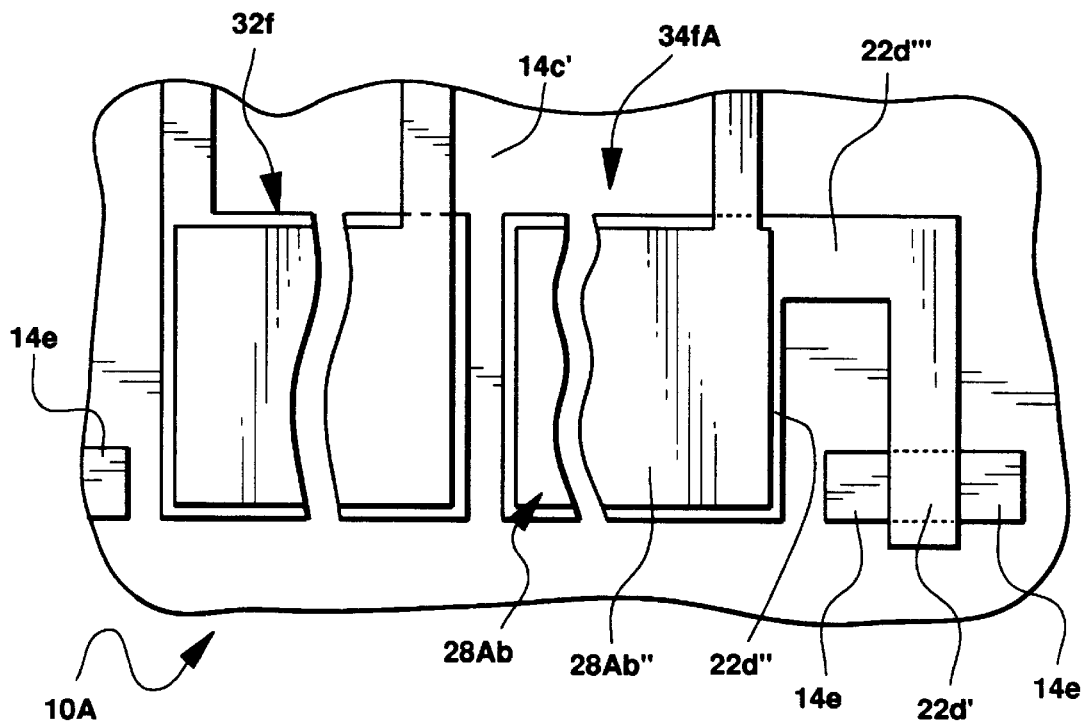
FIG. 21 shows a plan view of a variation in the control gate of the EPROM structure shown in FIG. 20, and is taken from the same perspective as FIG. 20, i.e., along a line such as line 20—20 of FIG. 13.

As mentioned above, FIG. 20 shows a top view of the poly to poly capacitor 32f and of our EPROM 34f. In the FIG. 20 view, the dielectric between the polysilicon layers is not shown, to better illustrate the comparison of the polysilicon plates. FIG. 20 shows that charging gate 28b has an arm-like extension 28b''' such as mentioned in the preceding paragraph. However, we have come to recognize that arm-like extension 28b''' is not necessary to charge the floating gate 22d. For manufacturing reasons, we prefer that charging gate 28b not even have arm-like extension 28b''', which includes its end 28b'. FIG. 21 shows such an alternative embodiment for charging gate 28b.

In FIG. 21, the alternative configuration of the charging gate is indicated by reference numeral 28Ab. The view in FIG. 21 is otherwise similar to the view shown in FIG. 20, and is taken from the same point of reference as FIG. 20. Thus, FIG. 21 shows a wafer 10A that has a poly to poly capacitor 32f and an alternative embodiment EPROM 34fA. In FIG. 21, the charging gate 28Ab of the alternative embodiment EPROM 34fA only has the large plate-like portion 28Ab'' on field oxide 14c'. However, the underlying floating gate 22d includes all three portions 22d', 22d'' and 22d'''. Since the plate portions 22d'' and 28Ab'' of these electrodes are quite large in actual use, as compared to the arm-like extension 22d''', this embodiment results in a satisfactory capacitance ratio Ccg-fg/Cfg-s. Still further, this design can allow a smaller minimum geometry of the gate over active areas 12c of our EPROM. This is because only one polysilicon layer crosses the active area.

An analogous schematic top view of the capacitor 32f and another embodiment 34fB of our EPROM is shown in FIG. 22. FIG. 22 is a view analogous to those of FIGS. 20 and 21. It shows a wafer 10B having a poly to poly capacitor 32f such as shown in FIGS. 1–20 and 21, alongside of our alternative embodiment EPROM 34fB. The FIG. 22 view is different from the FIGS. 20 and 21 views, in that it shows the top surface of wafer 10B after metallization. Accordingly, the upper surface of wafer 10B is covered with PSG layer 52, and additionally includes metal runners 60e and 60f of the metallization pattern. The upper ends of runners 60e and 60f respectively make contact with source and drain regions of our alternative EPROM 34fB. They make contact with the source and drain regions of our alternative EPROM 34fB in the same way runners 60e and 60f make contact with regions 44 in FIG. 19. Hence, they are given similar reference numerals.

As with the poly to poly capacitor 32f of FIGS. 1–20 and 21, poly to poly capacitor 32f of FIG. 22 could be connected to any polycrystalline silicon conductor or metal lines that one uses in the integrated circuit. The lower polysilicon layer of the capacitor 32f could be connected to a separate conductor or contact pad. On the other hand, it could alternatively be directly connected to one of the CMOS gates, as might be needed in any given circuit application.

In FIG. 22, the floating gate 22Bd (not seen under the charging gate) has a registered configuration similar to that of its overlying charging gate 28Bb, analogous to what is described in connection with floating gate 22d and its overlying charging gate 28b of FIGS. 1–20. However, the extension 28Bb''' of charging gate 28Bb is straight and short, as is its underlying floating gate extension. In this connection, it should be repeated that the elongated "L" shaped arm 28b''' shown in FIGS. 1–20 is shown that way only to achieve a single line of cross section that represents the invention. It is not likely that one would prefer any extension arm 28Bb''' in actual practice.

Reference is now made to FIG. 23. FIG. 23 shows a top view of still another embodiment 34fC of our EPROM. Embodiment 34fC is similar to embodiment 34fB of FIG. 22, except that the charging gate 28Cb of embodiment 34fC does not include an integral extension between contacts 60e and 60f, like extension 28Bb''' in FIG. 22. Thus, FIG. 23 shows a wafer 10C that is similar to wafer 10B of FIG. 22. Wafer 10C is covered with PSG 52 and has contacts 60e and 60f. Wafer 10C also includes a poly to poly capacitor 32f such as shown in FIGS. 1–20 and an alternative EPROM 34fC. Conductors 60e and 60f contact source and drain regions of an alternative EPROM 34fC, as they do in EPROM 34fB of FIG. 22. EPROM 34fC is functionally similar to EPROM 34f shown in FIGS. 1–20. Its configuration is identical to that of embodiment 34fB of FIG. 22, except that it does not have an extension of charging gate 28Cb in the channel area of EPROM 34fC between conductors 60e and 60f. This is analogous to the configuration of charging gate 28Ab in FIG. 21. This can readily be a preferred configuration for many applications, because it can result in the smallest high yield cell size.

The foregoing discussion discloses and describes several exemplary embodiments of the present invention. One skilled in the art will readily recognize from such discussion, and from the accompanying drawings and claims, that various changes, modifications and variations can be made therein without departing from the spirit and scope of the invention as defined in the following claims.

We claim:

1. A method of using two polysilicon layers to make an integrated circuit on a substrate of semiconductor material, which integrated circuit includes MOS transistors, a poly to poly capacitor and at least one EPROM transistor, said method comprising the steps of:

forming MOS transistors on thin oxide areas of said substrate using a process having about two micron or less design rules for the MOS transistors;

forming at least one capacitor on a field oxide area of said substrate, said capacitor comprising two spaced parallel plates of polycrystalline silicon;

concurrently also forming at least one EPROM transistor on said substrate, with the EPROM transistor having two spaced parallel plates of electrically conductive material and also having a first part disposed on a thin oxide area on the substrate and a much larger second part disposed on field oxide on said substrate, using a selected combination of steps used to make the MOS transistors and the capacitor, wherein the EPROM transistor has a charging gate/floating gate first capacitance, and a floating gate/substrate second capacitance; and providing a respective capacitance ratio between said first and second capacitances of about two:one or greater;

effective to allow the EPROM transistor to be made along with the MOS transistors and the capacitor by merely incorporating changes in masks used to make said integrated circuit, and the floating gate of the EPROM transistor to be charged at low voltages that can be handled by said MOS transistors.

2. The method of claim 1 wherein:

a first polysilicon layer forms the conductive material for the gate electrodes of said MOS transistors, a lower plate for said capacitor, and a floating gate for said EPROM.

3. The method of claim 2 wherein:

said floating gate for said EPROM includes not only a part that crosses over a channel region for the EPROM but also includes a much larger plate-like extension that is disposed on field oxide adjacent said channel region.

4. The method of claim 3 wherein:

a first polysilicon layer forms the conductive material for the upper plate of said capacitor and also for a charging plate over at least a portion of said plate-like extension of said floating gate; and the charging plate is aligned over said plate-like extension of the floating gate, effective to provide said capacitance ratio of about two or greater.

5. The method of claim 4 wherein:

the charging plate and the floating gate are spaced by successively depositing layers of silicon oxide and silicon nitride on the floating gate and then forming the charging plate on the silicon nitride layer.

6. The method of claim 4 wherein:

the capacitance ratio is about 2:1 to 5:1.

7. A method of making an EPROM transistor in a CMOS integrated circuit made with a process having two micron or less design rules, comprising the steps of:

forming a well of one conductivity type in a semiconductive substrate surface portion of opposite conductivity type, said well extending into said substrate from a surface area of said portion;

forming field oxide on other surface areas of said substrate surface portion;

forming gate oxide on said well surface area and on still other surface areas of said surface portion outside of said areas having field oxide;

depositing a first blanket layer of gate electrode material on said gate oxide and field oxide regions;

defining said first blanket layer into gate electrodes for complementary MOS transistors, a lower plate of a capacitor on said field oxide, and a first gate electrode for an EPROM MOS transistor on gate oxide, said first gate electrode having an integral enlargement that extends up onto said field oxide;

forming source and drain regions for said MOS transistors under the thin oxide at opposed edges of said gate electrodes, with the source and drain regions being of opposite conductivity type from the substrate surface in which they are disposed;

forming a blanket dielectric coating on said substrate;

defining patches of said dielectric coating that cover said lower plate of said capacitor and said EPROM first gate electrode, including the integral enlargement of said EPROM first gate electrode;

depositing a second blanket layer of gate electrode material on said dielectric layer;

defining said second blanket layer of gate electrode material into a portion of a component of said integrated circuit on said field oxide, and concurrently also defining a charging electrode aligned over said integral enlargement of said EPROM first gate electrode, said second gate electrode significantly overlapping at least said integral enlargement of said EPROM first gate electrode, whereby capacitance between overlapping portions thereof is at least about double any capacitance existing between said first gate electrode and said substrate; and forming appropriate conductive contacts to said source and drain regions and to said gate electrodes but not to said first gate electrode, effective to make an electrically floating gate out of said first gate electrode, and to also make said floating gate electrode chargeable by said charging electrode at voltages that can be safely handled by said MOS transistors in said integrated circuit.

8. The method of claim 7 wherein:

the first and second blanket layers of gate electrode material are polycrystalline silicon.

9. The method of claim 8 wherein:

the component, of which the second blanket layer of polycrystalline silicon gate electrode material forms a portion, is a capacitor disposed on field oxide; and the capacitor comprises overlapping spaced plates of the first and second blanket layers of polycrystalline silicon gate electrode material.

10. The method of claim 9 wherein:

the dielectric coating is formed by successively depositing blanket layers of silicon oxide and silicon nitride.

11. The method of claim 9 wherein:

the capacitance ratio is about 2:1 to 5:1.

* * * * *